US005385850A

United States Patent [19]

Chu et al.

[11] Patent Number: 5,385,850

[45] Date of Patent: Jan. 31, 1995

[54] METHOD OF FORMING A DOPED REGION IN A SEMICONDUCTOR SUBSTRATE UTILIZING A SACRIFICIAL EPITAXIAL SILICON LAYER

[75] Inventors: Jack O. Chu, Astoria; Chang-Ming Hsieh, Fishkill; Victor R. Nastasi, Hopewell Junction; Martin Revitz, Poughkeepsie; Paul A. Ronsheim, Wappingers Falls, all of N.Y.

[73] Assignee: International Business Machines Corporation, Armonk, N.Y.

[21] Appl. No.: 652,339

[22] Filed: Feb. 7, 1991

[51] Int. Cl.[6] .......... H01L 21/265

[52] U.S. Cl. .......... 437/31; 437/97; 437/141; 437/160

[58] Field of Search .......... 437/160, 97, 141, 31

[56] References Cited

U.S. PATENT DOCUMENTS

| | | | |
|---|---|---|---|
| 4,012,235 | 3/1977 | Mayer et al. | 437/160 |
| 4,101,349 | 7/1978 | Rooesner et al. | 437/97 |
| 4,116,732 | 9/1978 | Shier | 437/97 |
| 4,125,418 | 11/1978 | Vinton | 437/16 |
| 4,165,558 | 8/1979 | Armitage, Jr. et al. | 437/160 |
| 4,359,816 | 11/1982 | Abbas et al. | 437/41 |
| 4,379,726 | 4/1983 | Kumarmaru et al. | 437/97 |
| 4,431,460 | 2/1984 | Barson et al. | 148/1.5 |
| 4,623,426 | 11/1986 | Peters | 156/614 |
| 4,859,626 | 8/1989 | Wise | 437/81 |
| 4,894,349 | 1/1990 | Saito et al. | 437/95 |
| 5,008,207 | 4/1991 | Blouse et al. | 437/31 |

OTHER PUBLICATIONS

IEDM-89, pp. 221-224, by M. Sugiyama et al., "A 40GHz $f_T$ Si Bipolar Transistor LSI Technology" (1989).

Appl. Phys. Lett. 48(12), 1986, pp. 797-799 by B. S. Meyerson, "Low-temperature Silicon Epitaxy by Ultrahigh Vacuum/Chemical Vapor Deposition".

IBM Technical Disclosure Bulletin, vol. 30, No. 9, Feb 1988, "Low Temperature Fabrication Process for High-Performance MOSFETs".

*Primary Examiner*—George Fourson
*Assistant Examiner*—Long Pham
*Attorney, Agent, or Firm*—Harold Huberfeld

[57] ABSTRACT

A low temperature, epitaxial, in situ doped semiconductor layer is used as a sacrificial dopant source. The resulting doped region is small-dimensioned with a tightly controlled dopant concentration. The dopant layer is oxidized in a relatively low-temperature environment, and removed by etching. The process can be used to form a vertical bipolar transistor, where the doped region is the base, and wherein portions of the oxidized dopant layer are left as insulators.

9 Claims, 4 Drawing Sheets

16B 16A 16B 16 12 12 10

16B 16A 16B 16 12 18 12 10

12 18 10

METHOD OF FORMING A DOPED REGION IN A SEMICONDUCTOR SUBSTRATE UTILIZING A SACRIFICIAL EPITAXIAL SILICON LAYER

RELATED APPLICATIONS

This application is related to U.S. applications: Ser. No. 405,508 filed Sep. 11, 1989, by Rosenberg et al., now U.S. Pat. No. 5,008,207; Ser. No. 309,510 filed Feb. 13, 1989, by Harame et al., now U.S. Pat. No. 5,024,957; Ser. No. 602,822 filed Oct. 24, 1990, by Desilets et al., now U.S. Pat. No. 5,137,840; and Ser. No. 445,251 filed Dec. 1, 1990, by Chen et al. now U.S. Pat. No. 5,017,990.

FIELD OF THE INVENTION

The present invention is directed generally to the formation of semiconductor devices and more specifically to the use of a low temperature-formed epitaxial layer as a sacrificial dopant source for a semiconductor device region.

BACKGROUND OF THE INVENTION

In many semiconductor device structures, it is desirable to provide a doped semiconductor region of small dimension and well-controlled doping concentration. In a typical high-performance, vertical bipolar transistor, for example, it is desirable to provide an intrinsic base region of very shallow dimension, i.e. on the order of 50–100 nanometers (mm), and possessed of a well-controlled doping concentration.

Several methods are currently known for providing such small-dimensioned, well-controlled doped regions. Ion implantation, a process well understood in the art, is one method of forming a shallow doped region in a semiconductor substrate. Ion implantation, however, suffers from the disadvantage of channeling effects when used to implant boron to form the very thin regions of the type described herein.

Solid phase diffusion from polysilicon is another method of forming a very thin doped region. See, for example, U.S. Pat. No. 4,431,460 to Barson et al. (assigned to the assignee of the present invention), wherein various regions of a semiconductor device are out-diffused into a silicon substrate from a doped polysilicon layer. Such solid phase diffusion from polysilicon, however, can result in the uneven distribution of dopant atoms at the grain boundaries within the polysilicon, and at the polycrystalline-single crystal boundary between the polysilicon and the underlying silicon substrate.

Sugiyama, M., et al., "A 40 GHz $f_t$ Si Bipolar Transistor LSI Technology," IEDM-89, pgs. 221–224, shows a vertical bipolar transistor wherein a shallow base region is formed by solid phase out-diffusion from boro-silicate glass (BSG). The BSG is then removed to accommodate the formation of an emitter. BSG, however, is not a good diffusion source in that it is very difficult to control the dopant concentration provided therefrom. Further, like polysilicon, because the crystalline structure of BSG is different from that of silicon, an undesirable accumulation of dopant atoms occurs at the interface between the two materials.

Meyerson, B. S., "Low-Temperature Silicon Epitaxy by Ultrahigh Vacuum/Chemical Vapor Deposition," Appl. Phys. Lett. 48(12), 1986, pp. 797–799, shows a method of forming, at a low temperature and in a high vacuum, very thin layers of epitaxial silicon. These layers can be formed in situ doped to a very tightly controlled doping concentration. The teachings of Meyerson represent a recent and substantial contribution to the art. In fact, many device structures are currently known which incorporate the use of low temperature epitaxial (LTE) layers of the type taught by Meyerson.

The present inventors have determined, however, that it is not always desirable to retain the Meyerson LTE layer within a completed semiconductor device structure. Such LTE layers may, for example, exhibit crystalline defects not present in the underlying silicon, rendering the devices with undesirable transistor characteristics. The present inventors have further recognized the desirability of utilizing the well-controlled doping characteristics otherwise provided by a Meyerson LTE layer.

SUMMARY OF THE INVENTION

An object of the present invention is to provide a method of forming a small-dimensioned doped region, of well-controlled dopant concentration, within a semiconductor substrate.

Another object of the present invention is provide a method of forming such a doped region which is not susceptible to the channeling effects resulting from ion implantation of boron ions.

A further object of the present invention is to provide a method of forming such a doped region by solid phase diffusion which is not subject to the grain boundary build-up of dopant material found in the prior art.

In accordance with the present invention, there is provided a method of forming a doped region in a semiconductor substrate, comprising the steps of: providing a semiconductor substrate; forming a layer of in situ doped epitaxial semiconductor material at a temperature of less than about 700 degrees centigrade over an area on the semiconductor substrate where the doped region is to be formed; heating in a nonoxidizing environment to drive dopant from the epitaxial semiconductor layer into the substrate so as to form the doped region; oxidizing the epitaxial semiconductor layer at a temperature of less than about 650 degrees centigrade; and removing at least a portion of the oxidized layer to leave the doped region.

In accordance with another aspect of the present invention, there is provided a method of forming a bipolar transistor, comprising the steps of: providing a semiconductor substrate including a first region of a first conductivity type; forming a layer of in situ doped epitaxial semiconductor material at a temperature of less than about 700 degrees centigrade over the first region, the epitaxial semiconductor layer of a second conductivity type; heating in a nonoxidizing environment to drive dopant from the epitaxial semiconductor layer into the substrate, whereby to form a second region of the second conductivity type in the first region; oxidizing the epitaxial semiconductor layer at a temperature of less than about 650 degrees centigrade; removing at least a portion of the oxidized layer to expose the surface of the second region; and forming a third region of the first conductivity type in the second region.

DESCRIPTION OF THE DRAWING FIGURES

These and other objects, features, and advantages of the present invention will become apparent upon a consideration of the following detailed description of the invention, when read in conjunction with the drawing Figures, in which:

FIGS. 1A–1F are consecutive, cross-sectional views illustrating the formation of a doped semiconductor region in accordance with the present invention; and FIGS. 2A–2G are consecutive, cross-sectional views illustrating the fabrication of a vertical, bipolar transistor in accordance with the present invention.

DETAILED DESCRIPTION OF THE DRAWINGS

Figure 1A:
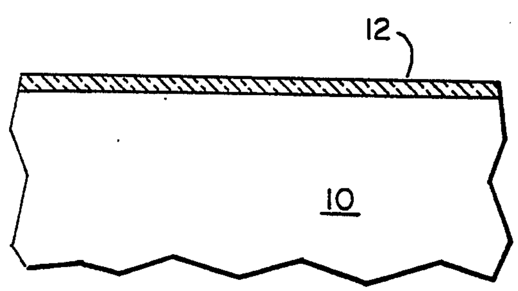

Referring now to FIG. 1A, a substrate 10 of semiconductor material is provided, for example comprising N type silicon having a <100> crystallograpic orientation and a resistivity in the range of 0.3 to 0.6 ohm-cm. A layer 12 of an insulating material is formed conformally over substrate 10 to a thickness in the range of 150 to 250 nm. Layer 12 comprises, for example, silicon dioxide ($SiO_2$), silicon nitride ($Si_3N_4$), or a stack of such materials.

It will be understood that, as used herein, "N" and "P" refer to dopant conductivity types, while "−" and "+" are used as appropriate to designate relative doping concentrations.

Figure 1D:
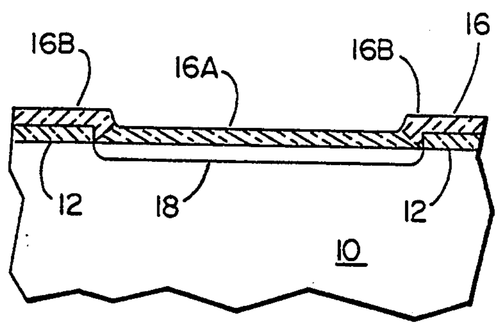
Figure 1B:
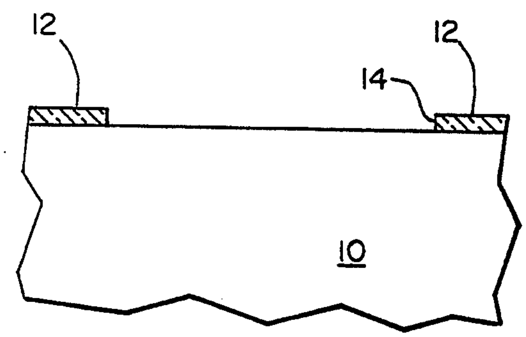

Referring now to FIG. 1B, a conventional photoresist mask (not shown) and an appropriate etchant are used to etch an aperture 14 in layer 12, exposing a portion of the surface of substrate 10.

Figure 1E:
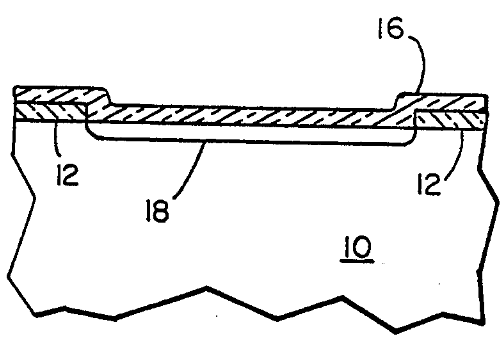
Figure 1C:
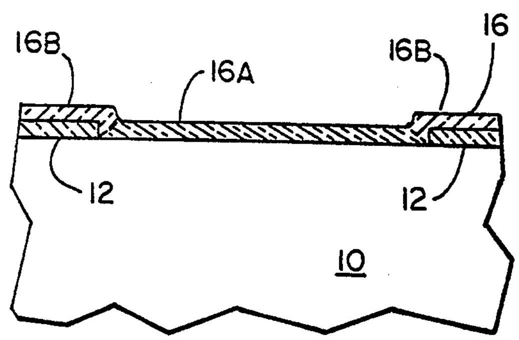

Referring now to FIG. 1C, a layer 16 of semiconductor material is formed conformally over the device so as to fill aperture 14, epitaxially replicating the crystalline structure of substrate 10 exposed therein. In accordance with the present invention, layer 16 is formed using a low-temperature epitaxial chemical vapor deposition (CVD) process, typically carried out at a temperature in the range of about 500–700 degrees centigrade, and at a pressure in the range of about $10^{-4}$–$10^{-2}$ torr during deposition.

A preferred low-temperature epitaxial process comprises subjecting the structure of FIG. 1B to a gaseous mixture of $SiH_4$ and $B_2H_6$/He (the dopant), in a flowing gaseous stream, at a temperature in the range of 550–650 degrees centigrade and at a pressure of about $10^{-3}$ torr (an ultra-high vacuum). Using such a process, layer 16 is epitaxial in structure within region 16A overlying substrate 10, and polycrystalline in structure within region 16B overlying insulator layer 12.

Using the above-described low-temperature/ultrahigh vacuum epitaxial process, the thickness of layer 16 can be controlled to a very high accuracy: i.e. on the order of plus-or-minus 0.5 nanometer. The dopant concentration of layer 16 can similarly be tightly controlled: i.e. on the order of ±5%. Further, the dopant concentration is substantially constant throughout the thickness of the layer, layer portion 16A thus containing a well-controlled quantity of dopant boron atoms. In the process illustrated in FIG. 1C, layer 16 is formed to a thickness of 20 nanometers, and a dopant concentration of $2\times10^{19}$ atoms/cm$^3$.

Referring now to FIG. 1D, the structure is submitted to a non-oxidizing thermal anneal sufficient to drive dopant from layer portion 16A into the underlying surface of substrate 10. P type region 18 is thus formed in the surface of substrate 10 within aperture 14 (FIG. 1B). This anneal can comprise, for example, 850 degrees centigrade for a period of 10–20 minutes in a non-oxidizing, $N_2$, environment.

Because layer portion 16A is epitaxial in nature, no grain boundary exists between this layer and the surface of underlying substrate region 10. Therefore, in accordance with a key advantage of the present invention, the dopant contained in layer portion 16A diffuses into substrate 10 uniformly, without any buildup at a grain boundary of the type that exists in the prior art. The thickness and dopant concentration of doped region 18 can thus be very closely controlled by the temperature and duration of the annealing step. For example, in accordance with the process parameters set out above, doped region 18 will have a thickness of about 50 nm, and a peak dopant concentration of $8\times10^{18}$ atoms/cm$^3$.

Figure 1F:
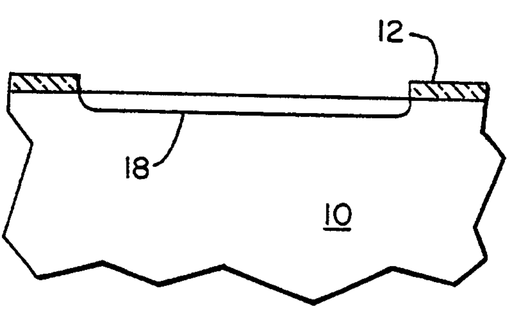

Referring now to FIG. 1E, the device is submitted to an oxidizing steam environment at a temperature less than about 650 degrees centigrade, preferably 600 degrees centigrade and 20 atm., for a time sufficient to oxidize the entirety of layer 16. These preferred parameters are selected so as to minimize or inhibit any temperature induced changes (i.e., deepening) of region 18. As shown in FIG. 1F, the device is then subjected to a wet etch, using BHF, so as to remove the entirety of layer 16 without any discernible disturbance to layer 12 or the surface of doped region 18. These oxidizing and etching steps have substantially no effect on the thickness or doping concentration of doped region 18.

There is thus formed a doped region 18 having a very tightly controlled thickness and doping concentration profile. The exposed surface of layer 18 is substantially defect free, the doped region thus being optimized for inclusion in a semiconductor device, for example of the type described and shown below.

Figure 2A:
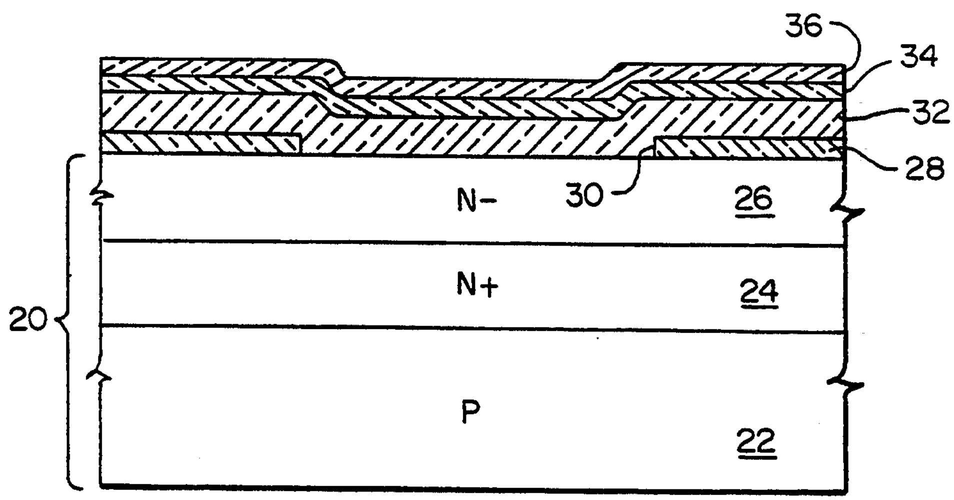

Referring now to FIG. 2A, a silicon semiconductor substrate 20 is shown including a P type layer 22, an overlying N+ type layer 24, and an overlying N− layer 26. Substrate 20 is formed by providing layer 22 from a conventional crystal melt to have an orientation of <100> and a resistivity in the range of 10–20 ohms-cm. The surface of layer 22 is doped heavily N+ by ion implantation, and an epitaxial silicon layer is grown thereon using a conventional, epitaxial CVD process. During this CVD process, the doped region in the surface of layer 22 diffuses downward into layer 22, and upward into the epitaxial layer to provide the structure shown in FIG. 2A.

A layer 28 of silicon dioxide is formed conformally over the upper surface of layer 26, and masked (not shown) and RIE etched with $CF_4$/$CF_3$/Ar to form an aperture 30. Aperture 30 thus exposes a portion of the surface of layer 26.

Still with reference to FIG. 2A, a layer 32 of P+ doped polysilicon is formed conformally over layer 28 so as to fill aperture 30. Layer 32 is formed by a conventional CVD process, and to a thickness of 300 nm. Layer 32 can be formed with in situ doping, or the layer can be formed intrinsically with subsequent ion implantation doping. A layer 34 of silicon dioxide is formed over layer 32 to a thickness 80–100 nm. A layer 36 of silicon nitride is formed over layer 34 to a thickness of 100–150 nm. Layer 34 is formed by thermal oxidation or chemical vapor deposition (CVD), while layer 36 is formed by CVD.

For purposes of best illustrating the present invention, FIGS. 2B–2G are enlarged around aperture 30.

Figure 2B:
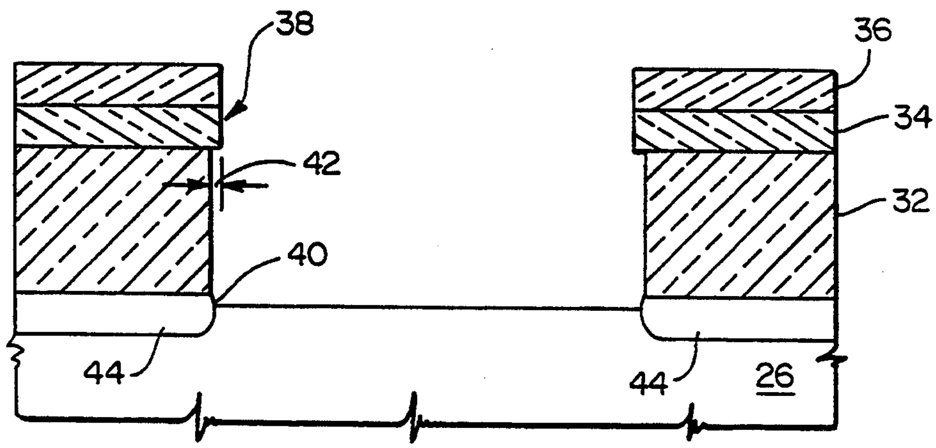

Referring now to FIG. 2B, an aperture 38 is etched sequentially through layers 36, 34, 32, and a short distance into the upper surface of layer 26 so as form a recess 40. This etching is accomplished using an appropriate photoresist mask (not shown), $CF_4$ to etch layer 36, $CF_3$/Ar to etch layer 34, $CF_4$ to etch layer 32, and $CF_4$ to etch recess 40 into the surface of layer 26. Using this process, layer 32 is undercut a lateral distance 42 of about 20 nanometers relative to layer 34.

Subsequent to the formation of aperture 38 as described above, the device is subjected to a thermal anneal to drive dopant from layer 32 into underlying layer 26, whereby to form P+ extrinsic base region 44. This anneal is performed at 925 degrees centigrade for a duration of 20–40 minutes.

Figure 2C:
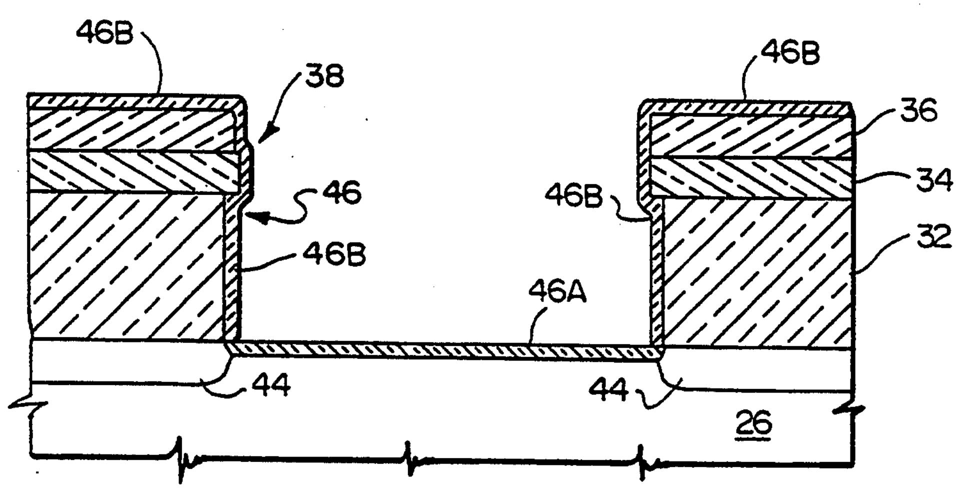

Referring now to FIG. 2C, a low-temperature, CVD epitaxial process is performed wherein the structure of FIG. 2B is subjected to a gaseous mixture of $SiH_4$ and $B_2H_6$/He (the dopant) in a flowing gaseous stream, at a temperature in the range of 550–650 degrees centigrade and at a pressure of about $10^{-3}$ torr (an ultra-high vacuum). A layer 46 of silicon is thus formed, the layer being epitaxial in structure in region 46A over layer 26, and polycrystalline in structure in remaining regions 46B. Layer 46 is formed to a thickness of 20 nanometers over silicon region 26 and polysilicon region 32. Layer 46 will, by the nature of the deposition process, be substantially thinner over layers 34 and 36. The dopant in the above-described epitaxial process is controlled so as to provide layer 46 with a dopant concentration of $2\times10^{19}$ atoms/$cm^3$.

Figure 2D:
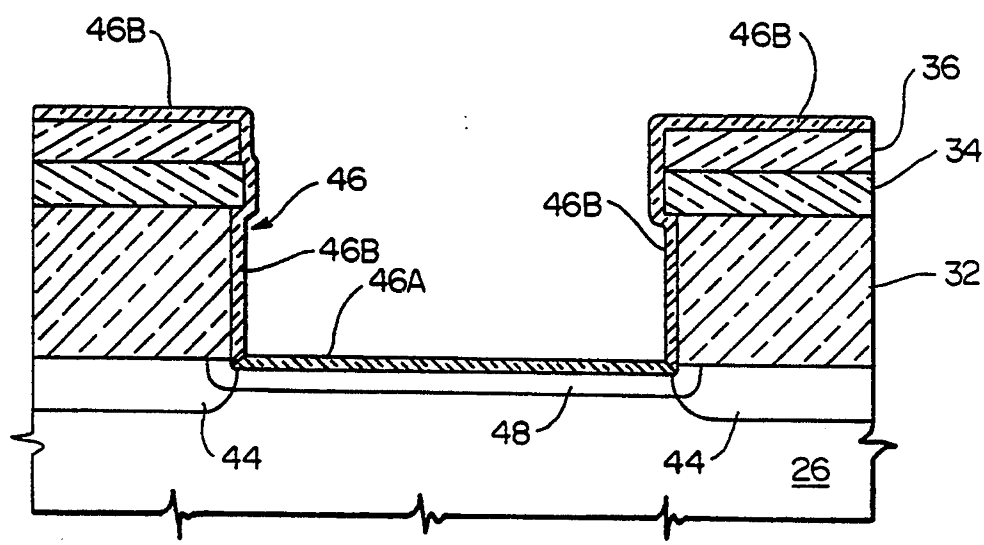

Referring now to FIG. 2D, the structure is submitted to a non-oxidizing thermal anneal sufficient to drive dopant from layer portion 46A into the underlying surface of layer 26. A P type region 48 is thus formed in the surface of layer 26 within aperture 38 (FIG. 2C). This anneal can comprise, for example, 850 degrees centigrade for a period of 10–20 minutes in a non-oxidizing, $N_2$, environment. The thickness and peak dopant concentration of doped region 48 are thus very tightly controlled to 50 nm, and $8\times10^{18}$ atoms/$cm^3$ respectively.

Figure 2E:
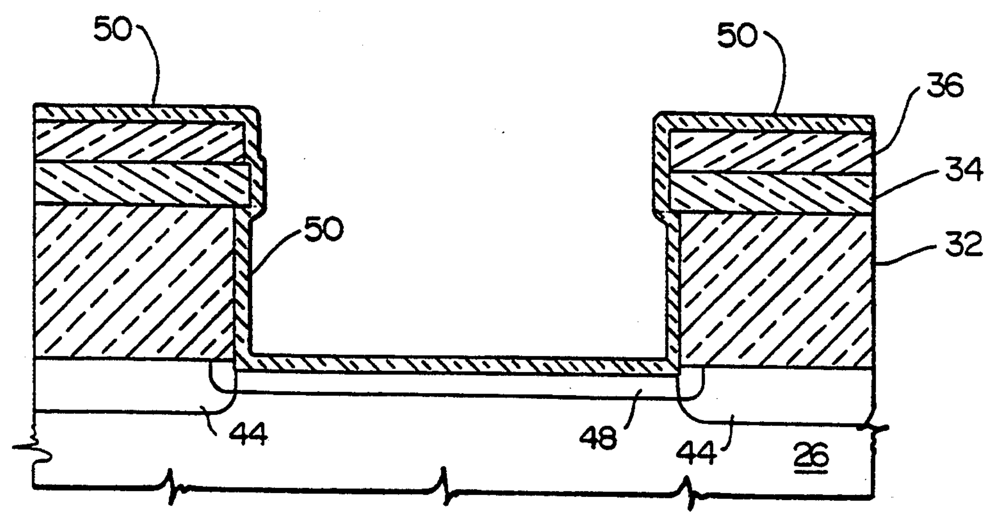

Referring now to FIG. 2E, the device is subjected to an oxidizing steam environment at 600 degrees centigrade and 20 atm. for a time sufficient to oxidize the entirety of layer 46, yielding a layer 50 of oxide having a peak thickness of about 500 Angstroms on the sidewalls of layer 32.

Figure 2F:
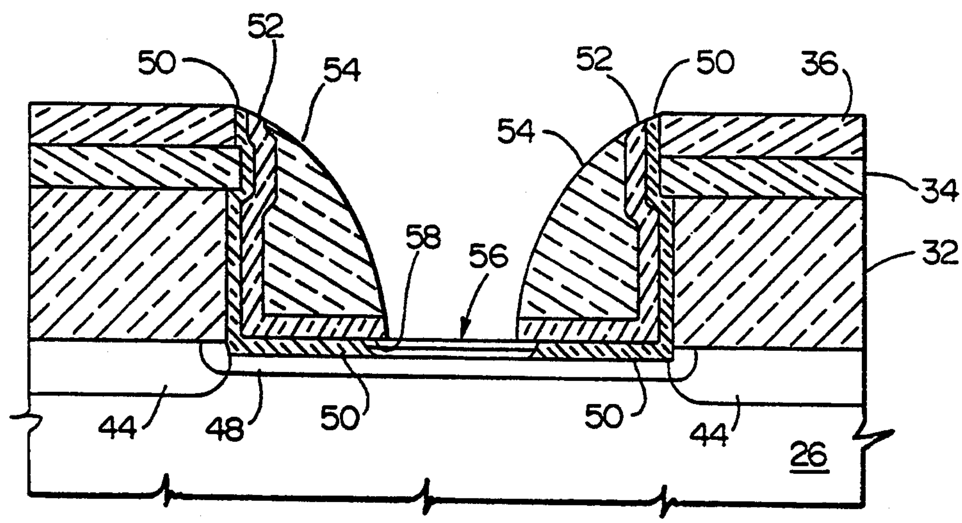

Referring next to FIG. 2F, a layer 52 of silicon nitride is formed conformally over the device, by a process of CVD, to a thickness of 50–80 nm. A layer 54 of silicon dioxide is formed conformally over layer 52 to a thickness of 150–200 nm, and the two layers are anisotropically etched to form the side-wall spacers 52/54 shown in FIG. 2F. This etching is performed using a RIE process with $CF_4/CF_3$/Ar and $Cl_2/O_2$/Ar in sequence.

Still with reference to FIG. 2F, subsequent to the forming of sidewall spacers 52/54, a BHF wet etch is used to remove the exposed portion of oxide layer 50, forming an aperture 56 having an undercut 58 extending laterally underneath of layer 52. It will be appreciated that this wet etch is highly selective to oxide over silicon, thus exposing a clean, undamaged surface of region 48 within aperture 56. The overetch to form undercut 58 insures the removal of all of oxide layer 50 where region 48 is exposed. This BHF wet etch also removes the oxide layer 50 on top of the nitride layer 36.

Figure 2G:
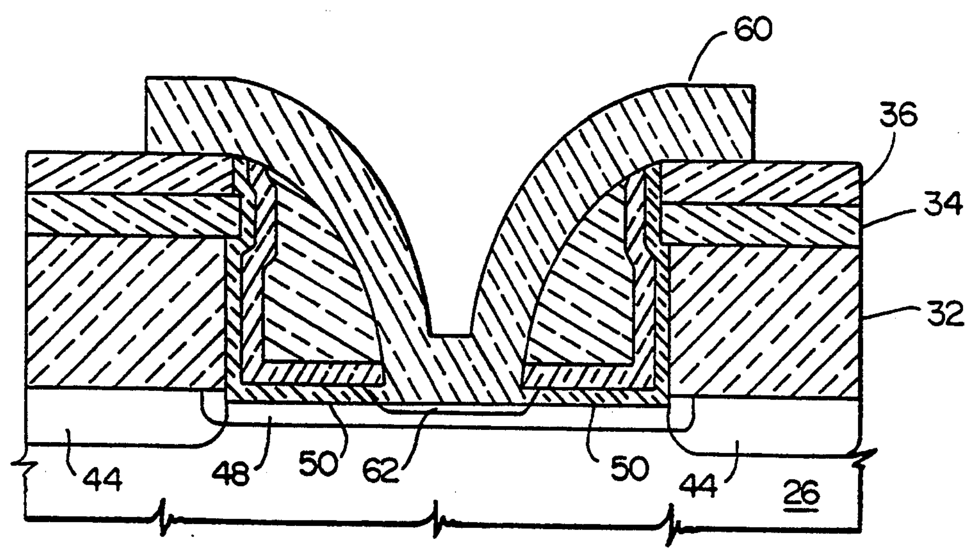

Referring now to FIG. 2G, a layer of N+ polysilicon is formed conformally over the device to a thickness of 150–200 nm. This layer is formed using a conventional CVD process, and can be formed in situ doped, or intrinsically with subsequent ion implantation. Conventional photoresist masking (not shown) and etching is used to provide the emitter region 60 covering spacers 52/54 and filling aperture 56 (FIG. 2F) as shown in FIG. 2G.

Subsequent to the formation of emitter region 60, the device is submitted to a relatively low-temperature anneal, at 850 degrees centigrade for 15–25 minutes, to drive dopant from region 60 into region 48, forming N+ emitter region 62 in the surface of region 48. This anneal is maintained at a sufficiently low temperature, and/or for a sufficiently short duration of time, to inhibit the further diffusion and deepening of region 48.

There is thus provided a vertical bipolar transistor, shown in FIG. 2G, having an emitter region 62, intrinsic and extrinsic base regions 48 and 44, respectively, and a collector region 26. Polysilicon contacts 32 and 60 are provided to extrinsic base region 44, and emitter region 62, respectively. Metal contacts can be provided in a conventional manner to complete the transistor.

In accordance with the present invention, intrinsic base region 48 is formed by outdiffusion from a low-temperature, epitaxially-grown layer 46 so as to be highly-controlled in thickness and dopant concentration. Layer 46 is subsequently sacrificed, through conversion to oxide layer 50 and partial removal, so as to be removed where emitter region 62 is formed, and so as to serve in remaining part (oxide layer 50) as an insulator between emitter polysilicon 60 and extrinsic base polysilicon 32.

There is thus provided a method for forming a doped region in a semiconductor substrate having highly-controlled thickness and dopant concentration characteristics. This doped region is formed through the use of a sacrificial, low-temperature, epitaxially-formed solid diffusion source. In contrast to the prior art, the present invention is not subject to the undesirable channeling effects typically associated with the ion implantation of boron ions. The epitaxial nature of the solid diffusion source inhibits grain boundary faults found in the use of polysilicon or glass.

The present invention has particular application in the formation of bipolar transistors of the type used to form very large scale integrated circuit (VLSI) devices.

While the present invention has been shown and described with respect to preferred embodiments, it is not thus limited. Numerous modifications, changes, and improvements will occur which fall within the scope of the invention.

What is claimed is:

1. A method of forming a doped region in a semiconductor substrate, comprising the steps of:

providing a semiconductor substrate;

forming a layer of in situ doped epitaxial semiconductor material at a temperature of less than about 700 degrees centigrade over an area on said semiconductor substrate where said doped region is to be formed said in situ doping providing a substantially constant dopant concentration throughout the thickness of said layer;

heating in a nonoxidizing environment to drive dopant from said epitaxial semiconductor layer into said substrate so as to form said doped region;

oxidizing substantially said entire epitaxial semiconductor layer at a temperature of less than about 650 degrees centigrade; and removing at least a portion of the oxidized layer to expose the surface of said doped region.

2. A method in accordance with claim 1 wherein said step of forming said epitaxial silicon layer is performed at a temperature in the range of 550–650 degrees centigrade.

3. A method in accordance with claim 1 wherein said step of oxidizing said epitaxial silicon layer is performed at a temperature of about 600 degrees centigrade and a pressure of about 20 atmospheres.

4. A method of forming a bipolar transistor, comprising the steps of:

providing a semiconductor substrate including a first region of a first conductivity type;

forming a layer of in situ doped epitaxial semiconductor material at a temperature of less than about 700 degrees centigrade over said first region, said epitaxial semiconductor layer of a second conductivity type;

heating in a nonoxidizing environment to drive dopant from said epitaxial semiconductor layer into said substrate, whereby to form a second region of said second conductivity type in said first region;

oxidizing said epitaxial semiconductor layer at a temperature of less than about 650 degrees centigrade;

removing at least a portion of the oxidized layer to expose the surface of said second region; and forming a third region of said first conductivity type in said second region.

5. A method in accordance with claim 4 wherein said step of forming said epitaxial silicon layer is performed at a temperature in the range of 550–650 degrees centigrade.

6. A method in accordance with claim 4 wherein said step of oxidizing said epitaxial silicon layer is performed at a temperature of about 600 degrees centigrade and a pressure of about 20 atmospheres.

7. A method in accordance with claim 4 wherein said bipolar transistor comprises a vertical bipolar transistor and said second region comprises the base region of said vertical bipolar transistor.

8. A method in accordance with claim 4 wherein a portion of the oxidized epitaxial silicon layer remains as an insulator between conductive regions.

9. A method in accordance with claim 1 where said epitaxial layer is formed to a thickness of less than 30 nanometers.

* * * * *